United States Patent
Hong et al.

(10) Patent No.: US 8,558,303 B2
(45) Date of Patent: Oct. 15, 2013

(54) SEMICONDUCTOR MEMORY DEVICES AND METHODS OF MANUFACTURING AND OPERATING SAME

(75) Inventors: Seunghun Hong, Seoul (KR); Sung Myung, Seoul (KR); Jiwoon Im, Seoul (KR); Minbaek Lee, Seoul (KR)

(73) Assignees: Samsung Electronics Co., Ltd., Gyeonggi-do (KR); Seoul National University Industry Foundation, Seoul (KR)

( * ) Notice: Subject to any disclaimer, the term of this patent is extended or adjusted under 35 U.S.C. 154(b) by 0 days.

(21) Appl. No.: 13/200,363

(22) Filed: Sep. 23, 2011

(65) Prior Publication Data
US 2012/0012817 A1    Jan. 19, 2012

Related U.S. Application Data

(63) Continuation of application No. 12/289,055, filed on Oct. 20, 2008, now Pat. No. 8,063,430.

(30) Foreign Application Priority Data

Oct. 18, 2007 (KR) .................. 10-2007-0105102
Oct. 2, 2008 (KR) .................. 10-2008-0097406

(51) Int. Cl.
*H01L 29/788* (2006.01)

(52) U.S. Cl.
USPC ............ 257/324; 438/211; 257/E21.682; 257/315; 977/842

(58) Field of Classification Search
USPC .......... 257/324, 325, E21.682; 977/774, 842; 438/211
See application file for complete search history.

(56) References Cited

U.S. PATENT DOCUMENTS

| 6,815,744 | B1 | 11/2004 | Beck et al. |
| 7,015,500 | B2 * | 3/2006 | Choi et al. ...................... 257/40 |
| 7,608,883 | B2 | 10/2009 | Radosavljevic et al. |
| 7,776,758 | B2 * | 8/2010 | Duan et al. .................... 438/758 |
| 2006/0118777 | A1 | 6/2006 | Hirakata et al. |

(Continued)

FOREIGN PATENT DOCUMENTS

| JP | 2002-537627 | 11/2002 |
| JP | 2005-45188 | 2/2005 |

(Continued)

OTHER PUBLICATIONS

Lee et al., Linker-free directed assembly of high-performance integrated devices based on nanotubes and nanowires, Oct. 4, 2006, nature nanotechnology, vol. 1, Oct. 2006, www.nature.com/naturenanotechnology.*

(Continued)

*Primary Examiner* — Jerome Jackson, Jr.
*Assistant Examiner* — Paul Budd
(74) *Attorney, Agent, or Firm* — Harness, Dickey & Pierce, P.L.C.

(57) ABSTRACT

A semiconductor device and methods of manufacturing and operating the semiconductor device may be disclosed. The semiconductor device may comprise different nanostructures. The semiconductor device may have a first element formed of nanowires and a second element formed of nanoparticles. The nanowires may be ambipolar carbon nanotubes (CNTs). The first element may be a channel layer. The second element may be a charge trap layer. In this regard, the semiconductor device may be a transistor or a memory device.

19 Claims, 14 Drawing Sheets

(56) References Cited

U.S. PATENT DOCUMENTS

| | | | |
|---|---|---|---|
| 2007/0064478 A1* | 3/2007 | Zhang et al. | 365/185.01 |
| 2009/0161438 A1 | 6/2009 | Sandhu et al. | |
| 2009/0285030 A1 | 11/2009 | Kang et al. | |
| 2010/0296340 A1 | 11/2010 | Basco et al. | |

FOREIGN PATENT DOCUMENTS

| | | |
|---|---|---|
| JP | 2005-285552 | 9/2005 |
| KR | 2003-0068029 | 8/2003 |
| KR | 10-2004-0060370 | 7/2004 |
| KR | 10-2007-0112733 | 11/2007 |
| KR | 10-2007-0121996 | 12/2007 |
| KR | 10-0806087 | 2/2008 |
| KR | 10-0850905 | 8/2008 |
| WO | WO 00/49659 | 8/2000 |

OTHER PUBLICATIONS

Steven A. McGill et al., "High-Performance, hysteresis-free carbon nanotube field-effect transistors via directed assembly", Oct. 20, 2006, Applied Physics Letters 89, pp. 163123-1 to 163123-3.*

Office Action for corresponding Japanese Patent Application No. 2004-365229 mailed Jul. 12, 2011 with English translation.

Robert White, Silicon Dioxide Etch using Buffered Hydrofluoric Acid, Jan. 25, 2007, Tufts University, pp. 1-4.

* cited by examiner

SEMICONDUCTOR MEMORY DEVICES AND METHODS OF MANUFACTURING AND OPERATING SAME

PRIORITY STATEMENT

This application is a continuation of U.S. application Ser. No. 12/289,055 filed Oct. 20, 2008, now U.S. Pat. No. 8,063,430 which claims the benefit of Korean Patent Application No. 10-2008-0097406, filed on Oct. 2, 2008, and Korean Patent Application No. 10-2007-0105102, filed on Oct. 18, 2007, in the Korean Intellectual Property Office, the entire contents of each of which are herein incorporated by reference.

BACKGROUND

1. Field

One or more example embodiments relate to a semiconductor device and methods of manufacturing and operating the semiconductor device.

2. Description of the Related Art

The degree of integration and the capacity of silicon (Si) based semiconductor devices may have been greatly improved. However, due to the limited characteristics of Si materials and limitations in manufacturing processes, it may be expected to be difficult to implement higher integration and higher capacity Si based semiconductor devices in the future.

Research into next generation devices that exceed the limit of current Si based semiconductor devices may have been conducted. For example, attempts to manufacture micro-devices having outstanding performance may have been made by applying nanostructures, e.g., carbon nanotubes (CNTs). CNTs may have diameters of several to several tens of nanometers (nm), may be favorable to smaller-sized devices, and may have outstanding properties of high mobility, high electric-conductivity, high thermal conductivity, high mechanical intensity, and the like. Thus, CNTs may have been highlighted as materials exceeding the limit of Si based semiconductor devices.

Nevertheless, it may be not easy to realize devices to which CNTs may be applied due to some unsolved problems. In more detail, it may be difficult to synthesize CNTs with reproducibility and handle the synthesized CNTs. For example, it may be necessary to precisely arrange CNTs on a desired area of a substrate for manufacturing a device to implement devices by using CNTs. In addition, it may be not easy to apply CNTs and other nanostructures to a single device, limiting the realization of various high capacity devices.

SUMMARY

One or more example embodiments may include a semiconductor device including nanostructures.

One or more example embodiments may include a method of manufacturing a semiconductor device including nanostructures.

One or more example embodiments may include a method of operating a semiconductor device including nanostructures.

Additional aspects and/or advantages will be set forth in part in the description which follows and, in part, will be apparent from the description, or may be learned by practice of example embodiments.

To achieve the above and/or other aspects and advantages, one or more example embodiments may include a semiconductor device comprising: a channel layer including a plurality of first nanostructures; a source electrode and a drain electrode contacting both ends of the channel layer; a first tunnel insulation layer formed on the channel layer; a first charge trap layer formed on the first tunnel insulation layer and including a plurality of second nanostructures different from the plurality of first nanostructures; a first blocking insulation layer formed on the first charge trap layer; and a first control gate formed on the first blocking insulation layer.

The plurality of first nanostructures may be ambipolar.

The plurality of first nanostructures may be nanowires.

The plurality of second nanostructures may be nanoparticles.

The channel layer may be formed on a hydrophilic layer.

A hydrophobic layer may be formed on the hydrophilic layer around the channel layer, and the source electrode and the drain electrode may be formed on the hydrophobic layer.

The first tunnel insulation layer may comprise sequentially stacked first and second insulation layers, and the second insulation layer may be a hydrophilic molecular layer or a hydrophobic molecular layer.

The semiconductor device may further comprise: a second control gate spaced apart from the channel layer, wherein the channel layer may be disposed between the first and second control gates.

The semiconductor device may further comprise: a second charge trap layer disposed between the channel layer and the second control gate; a second tunnel insulation layer disposed between the channel layer and the second charge trap layer; and a second blocking insulation layer disposed between the second charge trap layer and the second control gate.

The second charge trap layer may include nanoparticles.

The semiconductor device may be a transistor or a non-volatile memory device.

To achieve the above and/or other aspects and advantages, one or more example embodiments may include a method of manufacturing a semiconductor device, the method comprising: forming a channel layer including a plurality of first nanostructures on a substrate; forming a source electrode and a drain electrode contacting both ends of the channel layer; forming a first tunnel insulation layer on the channel layer; forming a first charge trap layer including a plurality of second nanostructures different from the plurality of first nanostructures on the first tunnel insulation layer; forming a first blocking insulation layer formed on the first charge trap layer; and forming a first control gate formed on the first blocking insulation layer.

The plurality of first nanostructures may be ambipolar.

The forming of the channel layer may comprise: forming a non-hydrophobic layer on the substrate; forming a hydrophobic layer having an opening used to expose a first area of the non-hydrophobic layer on the non-hydrophobic layer; and absorbing the plurality of first nanostructures in the first area exposed by the opening.

The plurality of first nanostructures may be nanowires.

The forming of the first tunnel insulation layer may comprise: forming an insulation layer that covers the channel layer, the source electrode, and the drain electrode; and forming an absorption layer that absorbs the plurality of second nanostructures on the insulation layer above the channel layer between the source electrode and the drain electrode.

The method may further comprise: forming an anti-absorption layer that does not absorb the plurality of second nanostructures on the insulation layer excluding the area on which the absorption layer may be to be formed after forming the insulation layer and before forming the absorption layer.

The plurality of second nanostructures may be nanoparticles.

The method may further comprise: forming a second control gate spaced apart from the channel layer, wherein the channel layer may be disposed between the first and second control gates.

The method may further comprise: forming a second charge trap layer between the channel layer and the second control gate; forming a second tunnel insulation layer between the channel layer and the second charge trap layer; and forming a second blocking insulation layer disposed between the second charge trap layer and the second control gate.

To achieve the above and/or other aspects and advantages, one or more example embodiments may include a method of operating the semiconductor device, the method comprising: trapping charges in the first charge tap layer.

The charges may be electrons or holes.

The semiconductor device may further comprise: a second charge trap layer and a second control gate, wherein the method further comprises: trapping electrons or holes in the second charge trap layer.

BRIEF DESCRIPTION OF THE DRAWINGS

Example embodiments will be more clearly understood from the following detailed description taken in conjunction with the accompanying drawings. FIGS. 1-10 represent non-limiting, example embodiments as described herein.

FIGS. 1 through 3 are cross-sectional views of a semiconductor device according to one or more example embodiments;

FIG. 5 is a graph illustrating characteristics of a gate voltage versus a drain current of the semiconductor device shown in FIG. 1 according to an example embodiment;

FIG. 6 is a graph illustrating a waveform of a gate voltage applied to the semiconductor device shown in FIG. 1 and a variation of a drain current with respect to the gate voltage according to an example embodiment;

FIG. 7 is a graph illustrating waveforms of two gate voltages applied to the semiconductor device shown in FIG. 2 and a variation of a drain current with respect to the two gate voltages according to an example embodiment;

FIG. 10 is a graph illustrating waveforms of two gate voltages applied to the semiconductor device shown in FIG. 3 and a variation of a drain current with respect to the two gate voltages according to an example embodiment.

Figure 1:
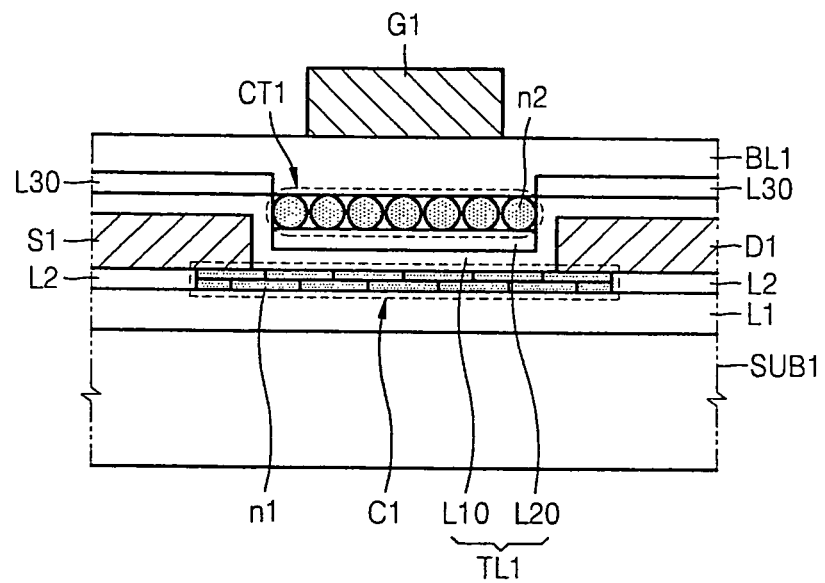

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor device according to an example embodiment.

Referring to FIG. 1, a channel layer C1 may be formed on a substrate SUB1. The channel layer C1 may include a plurality of first nanostructures n1. The first nanostructures n1 may be nanowires lying on the substrate SUB1. The first nanostructures n1 may be formed of an ambipolar material with n-type semiconductor characteristics and p-type semiconductor characteristics. The ambipolar material may be, for example, a carbon nanotube (CNT). Therefore, the channel layer C1 may include a plurality of nanowires formed of the CNT. A non-hydrophobic layer L1 may be disposed between the channel layer C1 and the substrate SUB1. The non-hydrophobic layer L1 may be formed on the entire surface of the substrate SUB1. The channel layer C1 may be formed on a predetermined area of the non-hydrophobic layer L1. The non-hydrophobic layer L1 may be a hydrophilic layer. For example, the non-hydrophobic layer L1 may be an insulating material layer, e.g., a $SiO_2$ layer, glass, an $Al_2O_3$ layer, a $ZrO_2$ layer, or an $HfO_2$ layer. A hydrophobic layer L2 may be formed on the non-hydrophobic layer L1 around the channel layer C1. The hydrophobic layer L2 may be a layer including hydrophobic molecules, e.g., OTS (octadecyl-trichlorosilane), OTMS (octadecyl-trimethoxysilane), OTE (octadecyl-triethoxysilane), or the like. Because the first nanostructures n1 may not be absorbed in the hydrophobic layer L2 but may be absorbed in the non-hydrophobic layer L1 (for example, a hydrophilic layer), the channel layer C1 may be self-assembled on the non-hydrophobic layer L1 on which the hydrophobic layer L2 may be not formed. A hydrophilic molecular layer (not shown) may be disposed between the non-hydrophobic layer L1 and the channel layer C1. In this case, the first nanostructures n1 may be self-assembled on the hydrophilic molecular layer (not shown). The hydrophilic molecular layer (not shown) may include hydrophilic molecules, e.g., APTES (aminopropyl-triexothysilane), MPTMS [(3-mercaptopropyl)trimethoxysilane], etc.

A source electrode S1 and a drain electrode D1 contact both ends of the channel layer C1. The source electrode S1 and the drain electrode D1 may extend onto the hydrophobic layer L2 from both ends of the channel layer C1. The source electrode S1 and the drain electrode D1 may be formed of metal, e.g., gold (Au) or palladium (Pd), a metal oxide, or semiconductor that may be heavily doped with a conductive impurity.

A first charge trap layer CT1 may be formed above the channel layer C1. The first charge trap layer CT1 may be called a floating gate as occasion demands. The first charge trap layer CT1 may include a plurality of second nanostructures n2. The second nanostructures n2 may have a structure different from that of the first nanostructure n1. For example, the second nanostructures n2 may be nanoparticles. The nanoparticles may be formed of at least one of metal, metal oxide, and semiconductor. For example, the second nanostructures n2 may be nanoparticles formed of a metal, e.g., gold (Au).

A first tunnel insulation layer TL1 may be disposed between the channel layer C1 and the first charge trap layer CT1. The first tunnel insulation layer TL1 may include a first layer L10 and a second layer L20 that may be sequentially formed on the channel layer C1. The first layer L10 may be formed on the source electrode S1 and the drain electrode D1. The second layer L20 may be formed above the channel layer C1 between the source electrode S1 and the drain electrode D1. A third layer L30 may be formed on the first layer L10 on which the second layer L20 may be not formed. The first layer L10 may be formed of $SiO_2$, $Al_2O_3$, $ZrO_2$, $HfO_2$ and another insulation material and may have a thickness less than 10 nm, for example, about 1 nm to about 5 nm. The second layer L20 may be an absorption layer used to easily absorb the second nanostructures n2, and may be a hydrophilic molecular layer or a hydrophobic molecular layer. The material of the second layer L20 may be determined according to the type of the second nanostructures n2. The third layer L30 may be an anti-absorption layer in which the second nanostructures n2 may be not absorbed. The third layer L30 may have characteristics opposite to those of the second layer L20. In more detail, if the second layer L20 may be the hydrophilic molecular layer, the third layer L30 may be the hydrophobic molecular layer. Alternatively, if the second layer L20 may be the hydrophobic molecular layer, the third layer L30 may be the hydrophilic molecular layer. Because the second nanostructures n2 may not be absorbed in the third layer L30 but may be absorbed in the second layer L20, the first charge trap layer CT1 may be self-assembled on the second layer L20. If the second nanostructures n2 may be gold (Au) nanoparticles, the second layer L20 may be formed of hydrophilic molecules, e.g., APTES, and the third layer L30 may be formed of hydrophobic molecules, e.g., OTS, OTMS, OTE, and the like. The second layer L20 may be unnecessary according to the materials of the second nanoparticles n2 and the first layer L10. Alternatively, the third layer L30 may be unnecessary but the second layer L20 may be necessary. In another case, the first layer L10 may be formed on the channel layer C1 between the source electrode S1 and the drain electrode D1 but the second layer L20 and the third layer L30 may be unnecessary.

A first blocking insulation layer BL1 may be formed on the first charge trap layer CT1 and the third layer L30. The first blocking insulation layer BL1 may be formed of, for example, $SiO_2$, $Al_2O_3$, $ZrO_2$, $HfO_2$, and other insulation materials. The first blocking insulation layer BL1 may be formed of a material that may be identical to or different from that of the non-hydrophobic layer L1 and the first layer L10. The first blocking insulation layer BL1 may be thicker than the first layer L10. For example, the thickness of the first blocking insulation layer BL1 may be greater than several tens of nm.

A first control gate G1 may be formed on the first blocking insulation layer BL1 above the first charge trap layer CT1. The first control gate G1 may be formed of metal, e.g., gold (Au) or palladium (Pd), a metal oxide, or semiconductor that may be heavily doped with a conductive impurity.

Figure 2:
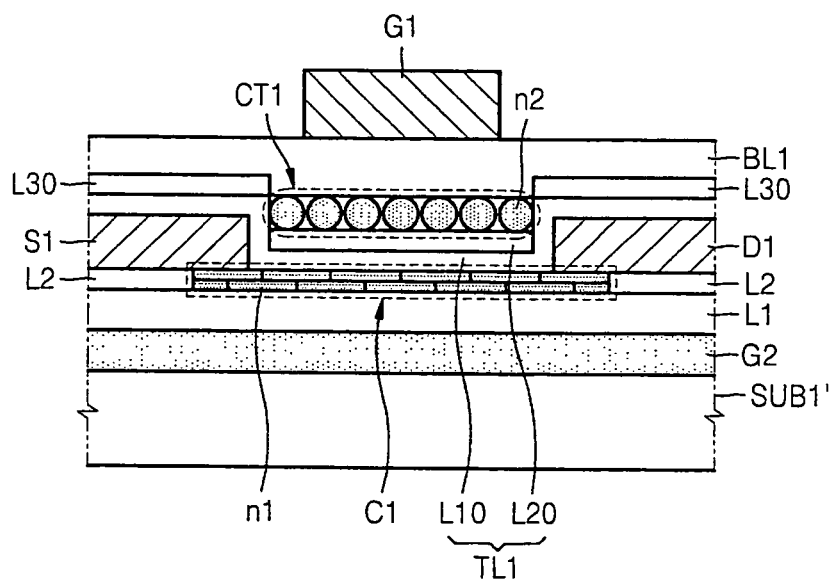
Figure 3:
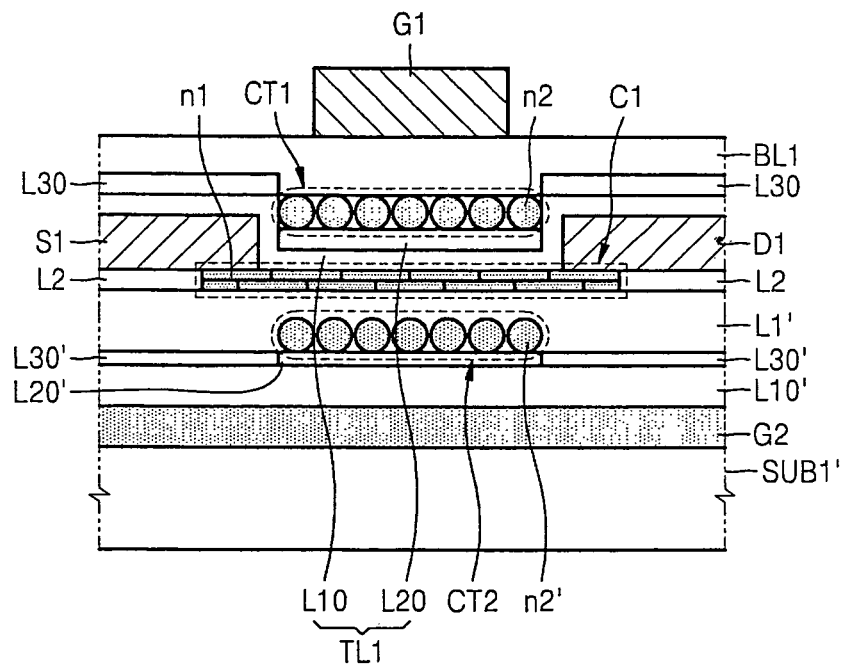

Although the semiconductor device having a single gate structure may be described with reference to FIG. 1, a semiconductor device having a double gate structure may be possible as shown in FIGS. 2 and 3.

FIG. 2 is a cross-sectional view of a semiconductor device according to an example embodiment.

Referring to FIG. 2, a second control gate G2 may be formed in an upper layer portion of a substrate SUB1'. The substrate SUB1' may be a semiconductor device. The second control gate G2 may be an area that may be heavily doped with a conductive impurity. The second control gate G2 may be formed under the channel layer C1, the source electrode S1, and the drain electrode D1 or may be formed only under the channel layer C1. The non-hydrophobic layer L1 disposed between the second control gate G2 and the channel layer C1 may be a gate insulation layer. The non-hydrophobic layer L2 and the upper structure thereof may be the same as described with reference to FIG. 1.

Alternatively, a second charge trap layer C2 may be disposed between the second control gate G2 and the channel layer C1 as shown in FIG. 3.

Referring to FIG. 3, the second charge trap layer CT2 may be disposed between the second control gate G2 and the channel layer C1. Similarly to the first charge trap layer CT1, the second charge trap layer CT2 may be called a floating gate. The second charge trap layer CT2 may include nanostructures. For example, the second charge trap layer CT2 may be similar to or the same as the first charge trap layer CT1. In more detail, the second charge trap layer CT2 may include nanostructures n2' that may be similar to or the same as the second nanostructures n2. However, example embodiments are not limited thereto. The second charge trap layer CT2 may have a different structure of the first charge trap layer CT1 or be formed of a different material from the first charge trap layer CT1. Layers L10', L20', and L30' may be disposed between the second charge trap layer CT2 and the second control gate G2. In more detail, a fourth layer L10' a may be formed on the second control gate G2, and a fifth layer L20' may be disposed between the second charge trap layer CT2 and the fourth layer L10'. The fifth layer L20' may be an absorption layer used to absorb the nanostructures n2'. A sixth layer L30' may be formed on the fourth layer L10' around the fifth layer L20'. The sixth layer L30' may be an anti-absorption layer in which the nanostructures n2' may be not absorbed. The fourth and fifth layers L10' and L20' disposed between the second charge trap layer CT2 and the second control gate G2 may be a second blocking insulation layer. The materials of the fourth through sixth layers L10', L20', and L30' may correspond to those of the first through third layers L10, L20, and L30, respectively. Therefore, the second charge trap layer CT2 may be self-assembled on the fifth layer L20'. The fifth and sixth layers L20' and L30' may be optional in the same manner as the second and third layers L20 and L30 may be optional. A non-hydrophobic layer L1' that covers the second charge trap layer CT2 may be formed on the sixth layer L30'. The non-hydrophobic layer L1' may correspond to the non-hydrophobic layer L1. The non-hydrophobic layer L1' disposed between the second charge trap layer CT2 and the channel layer C1 may be a second tunnel insulation layer. The structure formed on the non-hydrophobic layer L1' may be similar to that formed on the non-hydrophobic layer L1 shown in FIG. 1.

Although the second control gate G2 may be in the upper layer portion of the substrate SUB1' with reference to FIGS. 2 and 3, the second control gate G2 may be formed as a layer (a metal layer or a doped semiconductor layer) on the substrate SUB1'. Alternatively, the first charge trap layer CT1 and the first control gate G1 may be unnecessary with reference to FIG. 3. For example, a semiconductor device may have a bottom single gate structure.

FIGS. 4A through 4I are perspective views for explaining a method of manufacturing a semiconductor device according to an example embodiment.

Figure 4A:
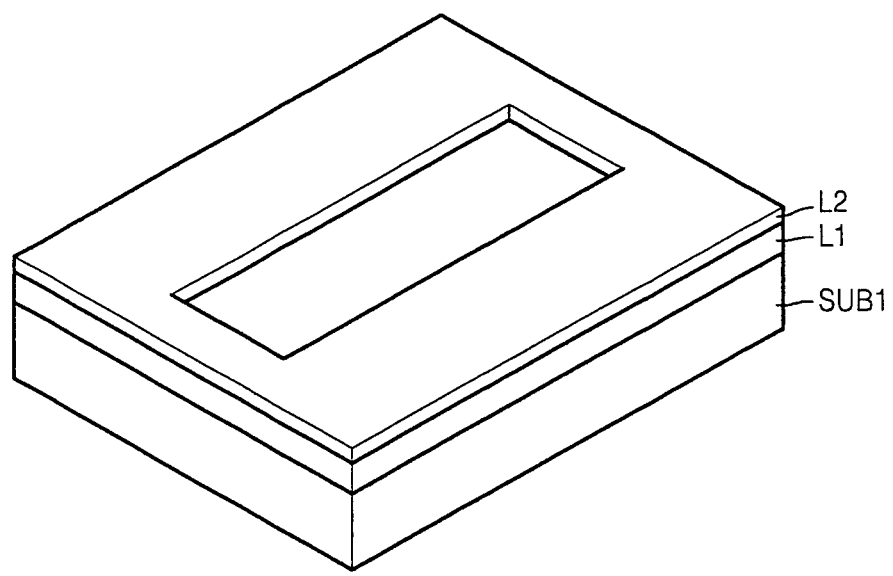
FIGS. 4A through 4I are perspective views for explaining a method of manufacturing a semiconductor device according to an example embodiment.

Referring to FIG. 4A, the non-hydrophobic layer L1 may be formed on the substrate SUB1. The non-hydrophobic layer L1 may be a hydrophilic layer. For example, the non-hydrophobic layer L1 may be an insulation material layer, e.g., a $SiO_2$ layer, glass, an $Al_2O_3$ layer, a $ZrO_2$ layer, and an $HfO_2$ layer. The hydrophobic layer L2 having an opening used to expose a part (hereinafter, referred to as a first area) of the non-hydrophobic layer L1 may be formed on the non-hydrophobic layer L1. The hydrophobic layer L2 may be a layer including hydrophobic molecules, e.g., OTS, OTMS, OTE, and the like. In more detail, the hydrophobic layer L2 may be formed by forming a resin layer (not shown) on the first area of the non-hydrophobic layer L1, putting the substrate SUB1 into solution in which the hydrophobic molecules may be dissolved, and absorbing the hydrophobic molecules in the other part of the non-hydrophobic layer L1 excluding the resin layer. The resin layer may be a sensitive layer and may be formed by using, for example, a photolithography method. Also, a solvent of the solution in which the hydrophobic molecules may be dissolved may not dissolve the resin layer like hexane. After the hydrophobic layer L2 may be formed, the resin layer may be selectively removed by using a solvent, e.g., acetone. A variety of methods may be used to form the hydrophobic layer L2. For example, a micro-contact printing method or the photolithography method may be used to form the hydrophobic layer L2.

Although not shown, a hydrophilic molecular layer may be formed on an exposed area of the non-hydrophobic layer L1, e.g., the first area. To this end, the substrate SUB1 may be put into the solution in which hydrophilic molecules may be dissolved. In this regard, the hydrophilic molecules may not be absorbed in the hydrophobic layer L2 but may be absorbed in the non-hydrophobic layer L1. The hydrophilic molecules may be, for example, APTES and MPTMS, etc. A solvent of the solution in which the hydrophilic molecules may be dissolved may be ethanol, hexane, etc. Because the non-hydrophobic layer L1 may be hydrophilic, it may be optional to form the hydrophilic molecular layer.

Figure 4B:
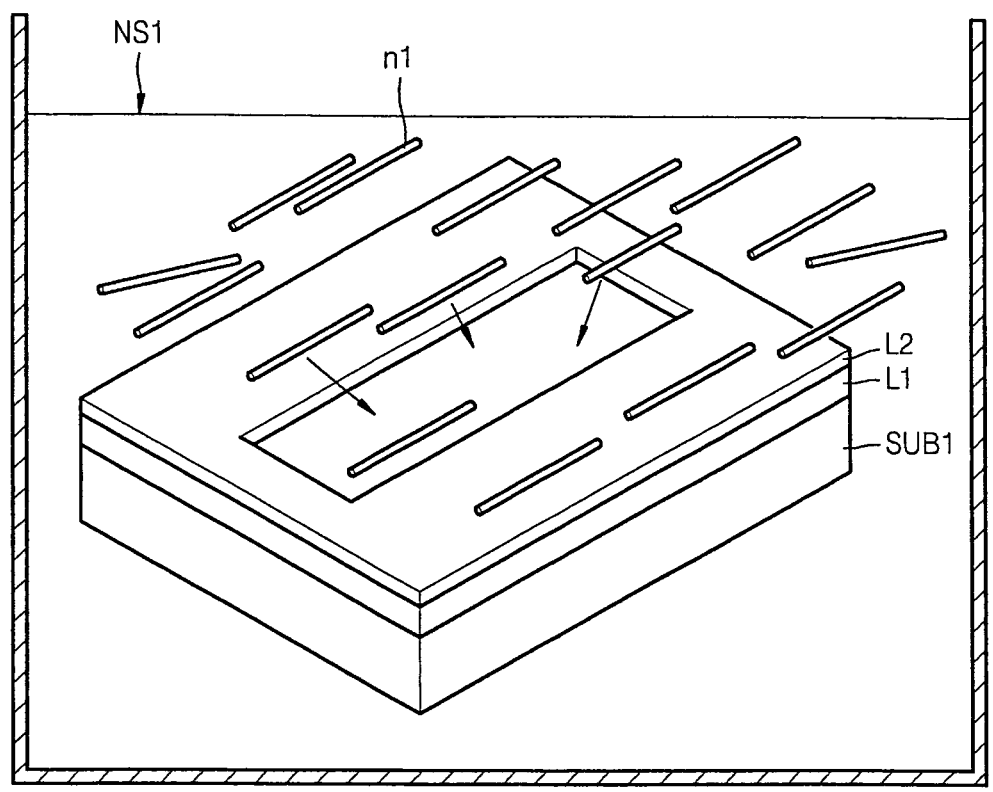

Referring to FIG. 4B, a solution (hereinafter, referred to as first nanostructure solution) NS1 in which first nanostructures n1 may be dissolved may be prepared. The first nanostructures n1 may be nanowires, for example, CNTs. A solvent, e.g., dichlorobenzene, of the first nanostructure solution NS1 may not affect the first nanostructures n1. The structure shown in FIG. 4A may be put into the first nanostructure solution NS1. Because the first nanostructures n1 may not be absorbed in the hydrophobic layer L2 but may be absorbed in the non-hydrophobic layer L1 (for example, a hydrophilic layer), the first nanostructures n1 may be self-assembled on the non-hydrophobic layer L1 on which the hydrophobic layer L2 may be not formed.

Figure 4C:
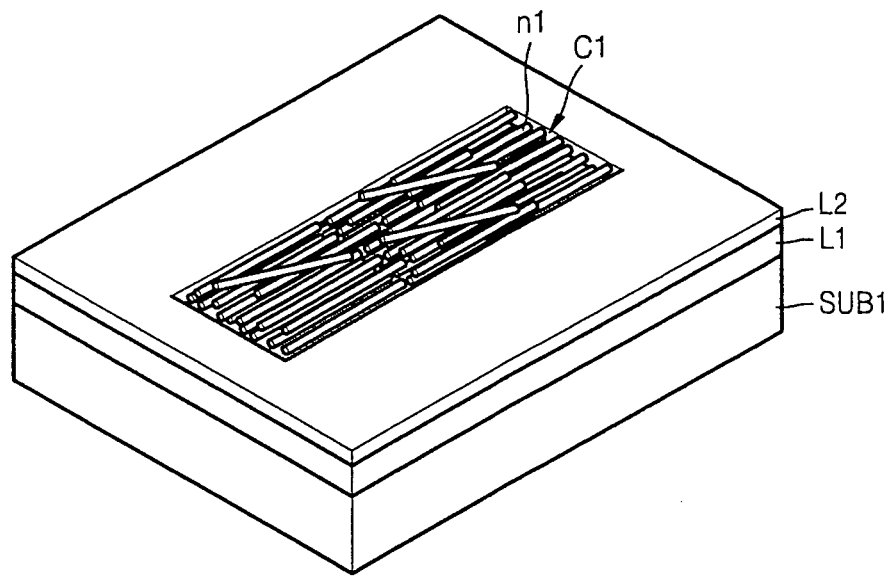

Referring to FIG. 4C, the plurality of first nanostructures n1 may comprise the channel layer C1. The self-assembly makes it possible to easily form the nanostructure channel layer C1 having a desired shape at a desired location of the substrate SUB1.

Figure 4D:
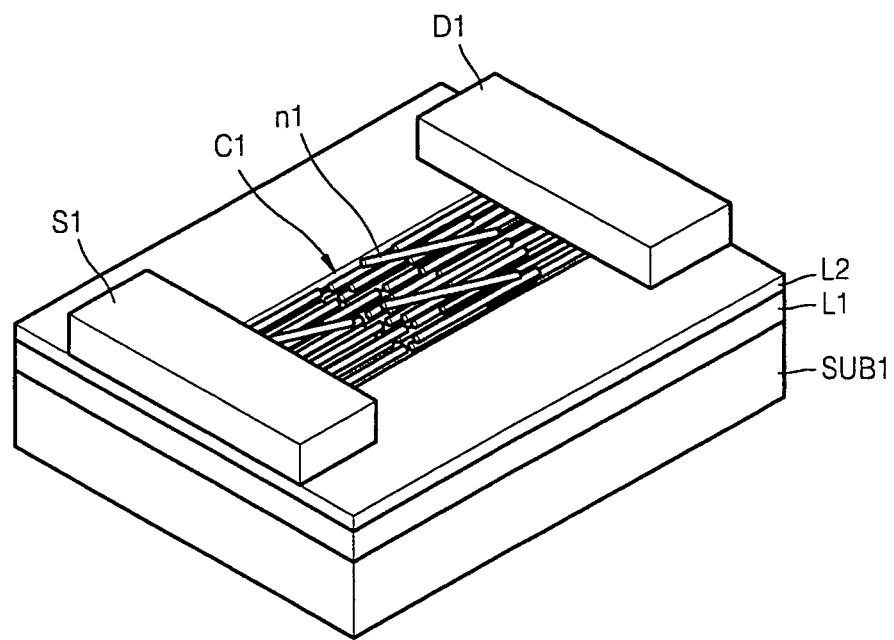

Referring to FIG. 4D, the source electrode S1 and the drain electrode D1 that contact both ends of the channel layer C1 may be formed. The source electrode S1 and the drain electrode D1 may extend onto the hydrophobic layer L2 from both ends of the channel layer C1. The source electrode S1 and the drain electrode D1 may be formed of metal, e.g., gold (Au) or palladium (Pd), a metal oxide, or semiconductor that may be heavily doped with a conductive impurity. In this regard, physical vapor deposition (PVD) or chemical vapor deposition (CVD), e.g., a sputtering method or a thermal evaporation method may be used to deposit a layer. A photolithography or E-beam method may be used to pattern the deposited layer.

Figure 4E:
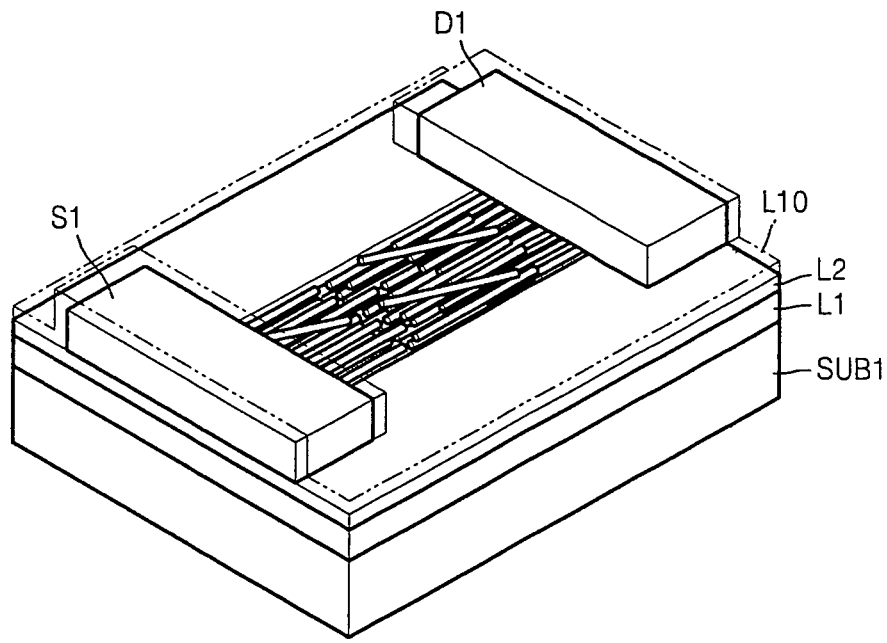

Referring to FIG. 4E, the first insulation layer L10 that covers the channel layer C1, the source electrode S1, and the drain electrode D1 may be formed on the hydrophobic layer L2. The first insulation layer L10 may be formed of $SiO_2$, $Al_2O_3$, $ZrO_2$, $HfO_2$ or another insulation material, and may have a thickness less than about 10 nm, for example, about 1 nm to about 5 nm. The CVD, plasma enhanced (PE)-CVD, and atomic layer deposition (ALD) may be used to form the first insulation layer L10. The process of forming the first insulation layer L10 may not affect characteristics of the first nanostructures n1.

Figure 4F:
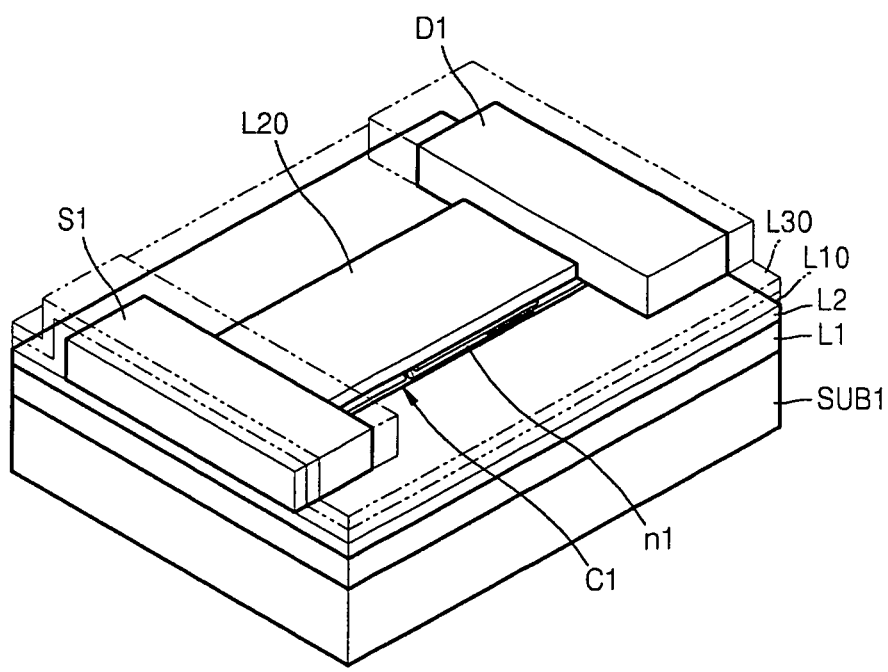

Referring to FIG. 4F, the second insulation layer L20 may be formed on the first insulation layer L10 above the channel layer C1 between the source electrode S1 and the drain electrode D1. The third insulation layer L30 may be formed on the first insulation layer L10 on which the second insulation layer L20 may be not formed. After the third insulation layer L30 may be formed, the second insulation layer L20 may be formed, and vice versa. The second insulation layer L20 may be an absorption layer that absorbs the second nanostructures n2 (see FIG. 4G). The third insulation layer L30 may be an anti-absorption layer that does not absorb the second nanostructures n2. One of the second and third insulation layers L20 and L30 may be hydrophilic and the other may be hydrophobic. For example, the second insulation layer L20 may be hydrophilic, and the third insulation layer L30 may be hydrophobic. In this case, similarly to the method of forming the hydrophobic layer L20 shown in FIG. 4A, the third insulation layer L30 may be formed before the second insulation layer L20 may be formed. In this regard, the substrate SUB1 on which the third insulation layer L30 may be formed may be put into a solution in which hydrophilic molecules may be dissolved so as to form the second insulation layer L20. In this case, because hydrophilic molecules may be not absorbed in the third insulation layer L30 but may be absorbed in the first insulation layer, the structure shown in FIG. 4F may be obtained. The hydrophilic molecules may be, for example, APTES and MPTMS, etc. A solvent of the solution in which the hydrophilic molecules may be dissolved may be ethanol, hexane, etc. Alternatively, the third insulation layer L30 may not be formed but the second insulation layer L20 may be formed, or both the third insulation layer L30 and the second insulation layer L20 may not be formed.

Figure 4G:
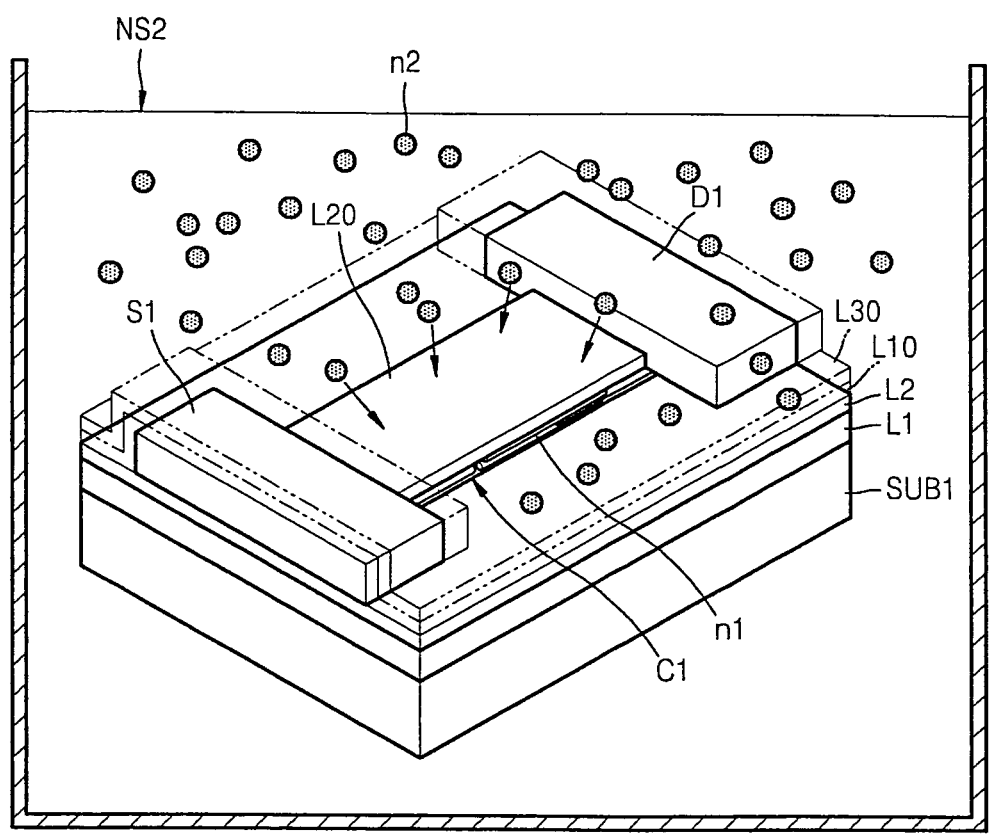

Referring to FIG. 4G, a solution (hereinafter, referred to as second nanostructure solution) NS2 in which the second nanostructures n2 may be dissolved may be prepared. The second nanostructures n2 may be, for example, nanoparticles. A solvent of the second nanostructure solution NS2 may be deionized water. The structure shown in FIG. 4F may be put into the second nanostructure solution NS2. Because the second nanostructures n2 may not be absorbed in the second insulation layer L20 but may be absorbed in the third insulation layer L30, the second nanostructures n2 may be self-assembled on the second insulation layer L20 as shown in FIG. 4H.

Figure 4H:
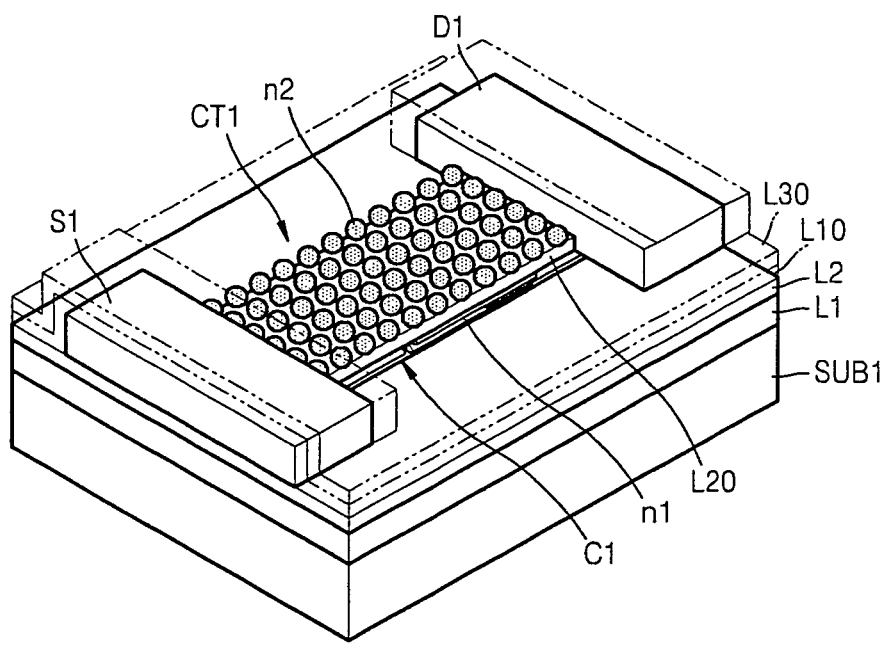

Referring to FIG. 4H, the self-assembled plurality of second nanostructures n2 may comprise the first charge trap layer CT1. The self-assembly makes it possible to easily form the first charge trap layer CT1 having a desired shape at a desired location of the substrate SUB1.

Figure 4I:
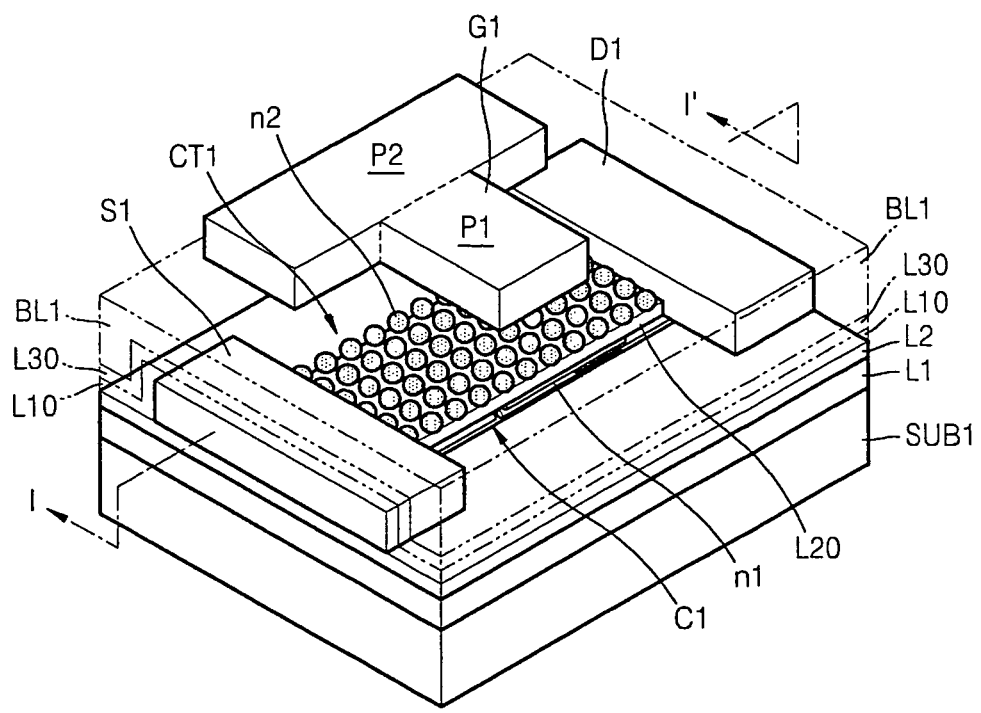

Referring to FIG. 4I, the first blocking insulation layer BL1 that covers the first charge trap layer CT1 may be formed on the third insulation layer L30. The first blocking insulation layer BL1 may be formed of, for example, $SiO_2$, $Al_2O_3$, $ZrO_2$, $HfO_2$, and other insulation materials. The first blocking insulation layer BL1 may be formed of a material that may be identical to or different from that of the non-hydrophobic layer L1 and the first layer L10. The first blocking insulation layer BL1 may be thicker than the first layer L10. For example, the thickness of the first blocking insulation layer BL1 may be greater than several tens of nm. The first blocking insulation layer BL1 may be formed using CVD, PE-CVD, ALD, or the like, which may not change characteristics of the second nanostructures n2. The first control gate G1 may be formed on the first blocking insulation layer BL1. The first control gate G1 may include a first part P1 above the center of the channel layer C1 and a second portion P2 extended from one end of the first part P1. The second part P2 may be perpendicular to the first part P1. The first control gate G1 may have a variety of shapes. The first control gate G1 may be formed of metal, e.g., gold (Au) or palladium (Pd), a metal oxide, or semiconductor that may be heavily doped with a conductive impurity. In this regard, PVD or CVD, e.g., a sputtering method or a thermal evaporation method may be used to deposit a layer. A photolithography or E-beam method may be used to pattern the deposited layer. A cross-sectional view taken a line I-I' of FIG. 4I may correspond to the structure shown in FIG. 1.

Although the method of manufacturing the semiconductor device having the single gate structure shown in FIG. 1 may be described with reference to FIGS. 4A through 4I, the semiconductor device having the double gate structure shown in FIGS. 2 and 3 may also be manufactured.

For example, before or after the non-hydrophobic layer L1 may be formed with reference to FIG. 4A, if the upper layer portion of the substrate SUB1 may be heavily doped with a conductive impurity, the second control gate G2 may be formed as shown in FIG. 2. Instead of doping the upper layer portion of the substrate SUB1 and forming the second control gate G2, the second control gate G2 may be formed on the substrate SUB1 as an additional layer. Also, similarly to the method of forming the first charge trap layer CT1, the second charge trap layer CT2 may be disposed between the second control gate G2 and the channel layer C1.

In the present embodiment, it may be easy to arrange predetermined nanostructures, for example, nanowires (CNTs) or nanoparticles on a desired area of a substrate. Also, at least two different nanostructures may be applied to a single device. Therefore, various high density devices may be easily manufactured by applying one or more nanostructures.

Hereinafter, a method of operating a semiconductor device, characteristics of the semiconductor device, and an applicable field thereof according to one or more example embodiments will now be described.

The semiconductor device shown in FIG. 1 may be operated by trapping electrons or holes in the first charge trap layer CT1 and applying a normal operation voltage to the source electrode S1, the drain electrode D1, and the first control gate G1. The type of charges trapped in the first charge trap layer CT1 may be changed while the semiconductor device may be used. A positive high voltage, for example, +10V, may be applied to the first control gate G1 so as to trap charges in the first charge trap layer CT1. In this regard, electrons travel from the channel layer C1 to the first charge trap layer CT1 and may be trapped according to the positive high voltage. A negative high voltage, for example, −10V, may be applied to the first control gate G1 so as to trap holes in the first charge trap layer CT1. In this regard, holes travel from the channel layer C1 to the first charge trap layer CT1 and may be trapped according to the negative high voltage. Characteristics of the semiconductor device may vary according to which charges (electrons or holes) may be trapped in the first charge trap layer CT1 by applying the positive or negative high voltage to the first control gate G1. For example, when holes may be trapped in the first charge trap layer CT1 by applying the negative high voltage to the first control gate G1, the semiconductor device may have the characteristics of an n-type channel transistor (hereinafter, referred to as an n-type transistor) within the normal operation voltage range. When electrons may be trapped in the first charge trap layer CT1 by applying the positive high voltage to the first control gate G1, the semiconductor device may have the characteristics of a p-type channel transistor (hereinafter, referred to as a p-type transistor) within the normal operation voltage range. This will be described in more detailed with reference to FIG. 5.

Figure 5:
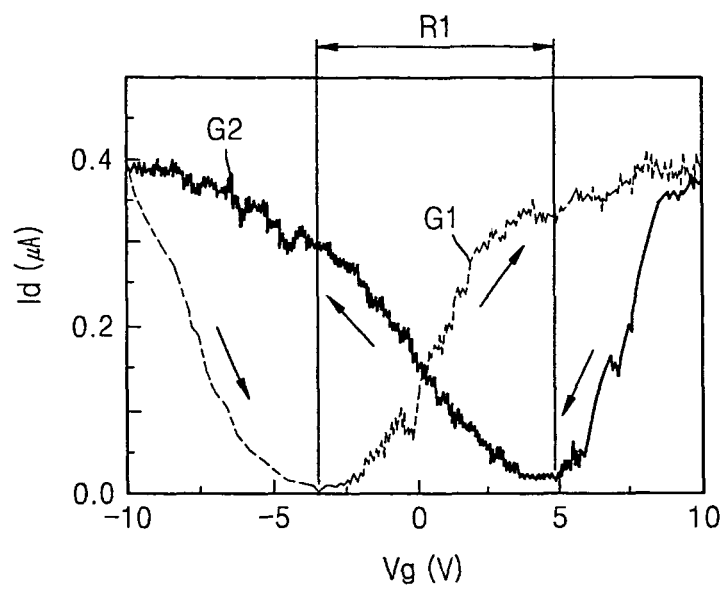

FIG. 5 is a graph illustrating characteristics of a gate voltage Vg versus a drain current Id of the semiconductor device shown in FIG. 1 according to an example embodiment. The gate voltage Vg may be applied to the first control gate G1, and the drain current Id flows between the source electrode S1 and the drain electrode D1. The drain current Id may be measured by varying the gate voltage Vg. A drain voltage of 1V may be applied between the source electrode S1 and the drain electrode D1.

Referring to FIG. 5, a graph (hereinafter, referred to as a first graph) showing that the gate voltage Vg may be increased from −10V to +10V and a graph (hereinafter, referred to as a second graph) G2 showing that the gate voltage Vg may be reduced from +10V to −10V may be entirely different from each other. For example, an electric hysteresis between the first and second graphs G1 and G2 may be different. In more detail, when the gate voltage Vg may be applied at −10V, the semiconductor device may have the characteristics of the first graph G1 until the gate voltage Vg may be applied at +10V. When the gate voltage Vg may be applied at −10V, holes may be trapped in the first charge trap layer CT1 so that an electric field applied to the channel layer C1 increases in a positive direction. Therefore, the first graph G1 may be in a negative direction as a whole. If holes may be trapped in the first charge trap layer CT1, charges trapped in the first charge trap layer CT1 remain holes at the positive voltage below a threshold voltage. When the positive high voltage exceeding the threshold voltage may be applied, charges trapped in the first charge trap layer CT1 may be changed to electrons. If the gate voltage Vg may be reduced from +10V corresponding to the positive high voltage exceeding the threshold voltage, the semiconductor device may have the characteristics of the second graph G2 until the gate voltage Vg may be applied at −10V. If the gate voltage Vg of +10V may be applied, the electrons may be trapped in the first charge trap layer CT1 so that an electric field applied to the channel layer C1 may be reduced in the negative direction. Therefore, the second graph G2 may be in the positive direction as a whole.

The characteristics of the gate voltage Vg and the drain current Id may dramatically vary according to charges trapped in the first charge trap layer CT1. The first graph G1 and the second graph G2 may have opposite characteristics within a predetermined voltage range. For example, when the gate voltage Vg increases within the gate voltage Vg range (hereinafter, referred to as a first range) R1 from about −4V to about +5V, the first graph G1 increases, whereas the second graph G2 decreases. The characteristics of the n-type transistor may be that the drain current Id increases according to the increase of the gate voltage Vg. The characteristics of the p-type transistor may be that the drain current Id decreases according to the increase of the gate voltage Vg. The normal operation voltage may be within the first range R1. Therefore, the semiconductor device may have the characteristics of the n-type transistor or the characteristics of the p-type semiconductor transistor according to the type of charges trapped in the first charge trap layer CT1. This means that the semiconductor device may be used as the n-type transistor so as to attain a predetermined first goal, and used as the p-type transistor by switching the type of the semiconductor device so as to attain a predetermined second goal. The semiconductor device of the present embodiment may be a reversible type-switching device (transistor or memory device) and thus it may have various advantages. For example, a reconfigurable circuit may be manufactured.

Figure 6:
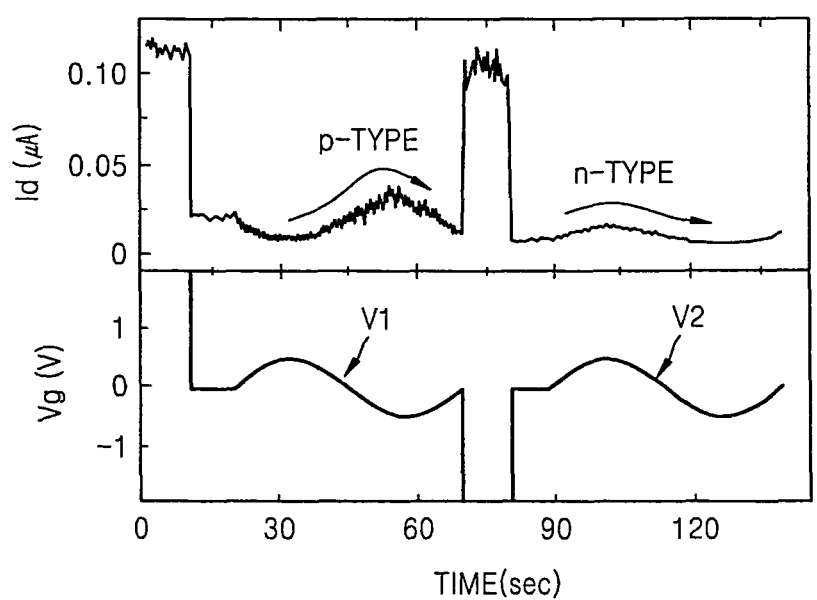

FIG. 6 is a graph illustrating a waveform of the gate voltage Vg applied to the semiconductor device shown in FIG. 1 and a variation of the drain current Id with respect to the gate voltage Vg according to an example embodiment.

Referring to FIG. 6, when a positive high voltage and a first voltage V1 with a small intensity may be sequentially applied to the first control gate G1, the waveform of the first voltage V1 may be contrary to that of the drain current Id generated by the waveform of the first voltage V1. If the positive high voltage may be applied to the first control gate G1, the semiconductor device may have the characteristics of the p-type transistor. When a negative high voltage and a second voltage V2 with a small intensity may be sequentially applied to the first control gate G1, the waveform of the second voltage V2 may be similar to that of the drain current Id generated by the waveform of the second voltage V2. If the negative high voltage may be applied to the first control gate G1, the semiconductor device may have the characteristics of the n-type transistor.

If the semiconductor device may be used as a memory device, the amount of the drain current Id may vary according to charges (electrons or holes) trapped in the first charge trap layer CT1 or whether charges may be trapped or not. Thus, it may be possible to realize a non-volatile memory device that uses the first charge trap layer CT1 as a memory layer.

Figure 7:
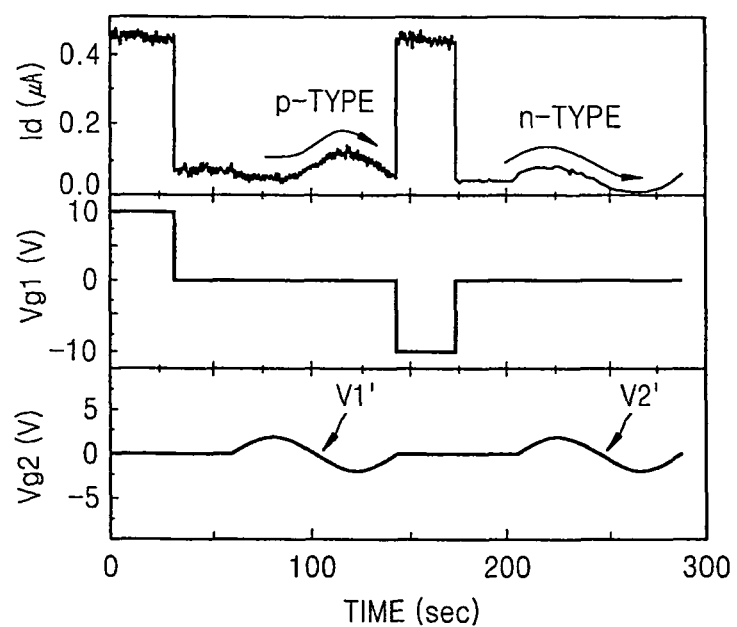

FIG. 7 is a graph illustrating waveforms of two gate voltages (hereinafter, referred to as first and second gate voltages) Vg1 and Vg2 applied to the semiconductor device, e.g. a double gate device, shown in FIG. 2 and a variation of the drain current Id with respect to the first and second gate voltages Vg1 and Vg2 according to an example embodiment. The first and second gate voltages Vg1 and Vg2 may be applied to the first and second control gates G1 and G2, respectively, shown in FIG. 2.

Referring to FIG. 7, when a first voltage V1' of a normal operation voltage may be applied to the second control gate G2 after the first gate voltage Vg1 of +10V may be applied, the waveform of the drain current Id generated by the waveform of the first voltage V1' may be contrary to that of the first voltage V1'. Because of the application of the first gate voltage Vg1 of +10V, the semiconductor device may have the characteristics of the p-type transistor. Also, the semiconductor device may be normally operated by using the second control gate G2 after electrons may be trapped in the first charge trap layer CT1 by the first control gate G1. When a second voltage V2' of the normal operation voltage may be applied to the second control gate G2 after the first gate voltage Vg1 of −10V may be applied, the waveform of the drain current Id generated by the waveform of the second voltage V2' may be similar to that of the second voltage V2'. Because of the application of the first gate voltage Vg1 of −10V, the semiconductor device may have the characteristics of the n-type transistor. Also, the semiconductor device may be normally operated by using the second control gate G2 after holes may be trapped in the first charge trap layer CT1 by the first control gate G1. In more detail, after electrons or holes may be trapped in the first charge trap layer CT1, the normal operation voltage may be applied to the source electrode S1, the drain electrode D1, and the first control gate G1, or the normal operation voltage may be applied to the source electrode S1, the drain electrode D1, and the second control gate G2. The semiconductor device shown in FIG. 2 may be used as a transistor or a memory device.

Figure 8A:
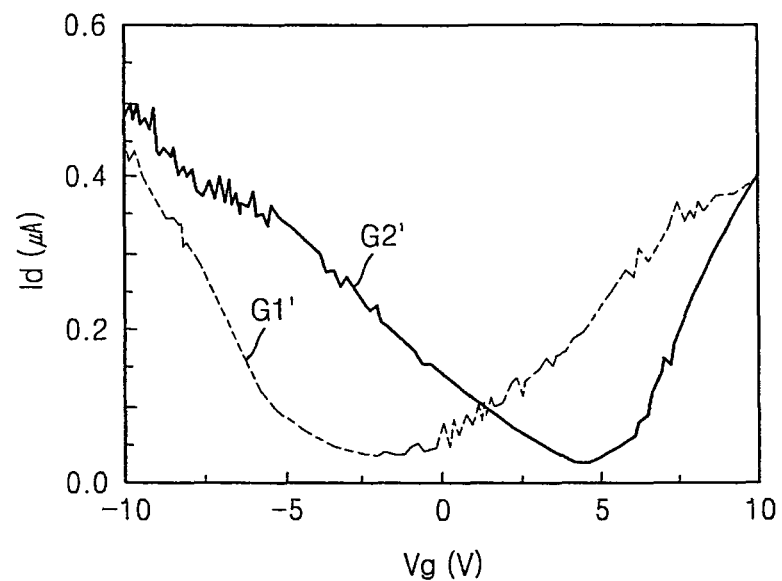
FIGS. 8A and 8B are graphs illustrating characteristics of a gate voltage versus a drain current of two semiconductor devices having the structure shown in FIG. 3 and having a different manufacturing method according to an example embodiment.
Figure 8B:
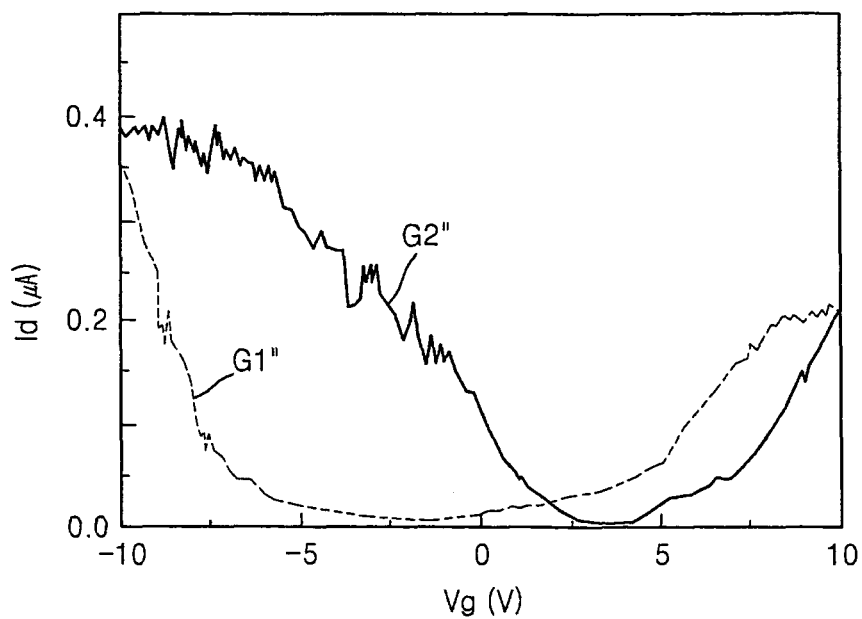

FIGS. 8A and 8B are graphs illustrating characteristics of the gate voltage Vs versus the drain current Id of two semiconductor devices having the structure shown in FIG. 3 and having a different manufacturing method according to an example embodiment. The gate voltage Vg may be applied to the first control gate G1. The drain current Id flows between the source electrode S1 and the drain electrode D1. The drain current Id may be measured by varying the gate voltage Vg. A drain voltage of 1V may be applied between the source electrode S1 and the drain electrode D1.

Referring to FIG. 8A, similarly to the graph shown in FIG. 5, when the gate voltage Vg increases from about −4V to about +5V, a first graph G1' may have the characteristics of an n-type transistor and a second graph G2' may have the characteristics of a p-type transistor.

Referring to FIG. 8B, when a positive high voltage may be applied, the drain current Id may be about 0.2 µA, which may be reduced from the drain current Id of about 0.4 µA shown in FIG. 8A. Also, when the gate voltage Vg increases from about −10V to about 0V, a first graph G1" and a second graph G2" may have the characteristics of the p-type transistor.

In more detail, the semiconductor device in FIG. 8A may have both the characteristics of the n-type transistor and of the p-type transistor, whereas the semiconductor device may have just the characteristics of the p-type transistor and not the characteristics of the n-type transistor. Such a difference shows that the semiconductor devices that may be similar in terms of the structure may be different from each other in terms of hysteresis, e.g. the characteristics of the gate voltage Vg versus the drain current Id according to the method of manufacturing the semiconductor devices. This may be applied to the semiconductor devices shown in FIGS. 1 and 2 in the same manner.

To operate the semiconductor device shown in FIG. 3, electrons or holes may be trapped in the first charge trap layer CT1, electrons or holes may be trapped in the second charge trap layer CT2, and a normal operation voltage may be applied to the source electrode S1, the drain electrode D1, and the first control gate G1, or the normal operation voltage may be applied to the source electrode S1, the drain electrode D1, and the second control gate G2. The semiconductor device shown in FIG. 3 may be used as a transistor or a memory device like the semiconductor devices shown in FIGS. 1 and 2. Because the semiconductor device shown in FIG. 3 may have the two charge trap layers CT1 and CT2, the semiconductor device shown in FIG. 3 may have more statuses than those of the semiconductor devices shown in FIGS. 1 and 2. When the semiconductor device shown in FIG. 3 may be used as the memory device, the semiconductor device shown in FIG. 3 may have statuses corresponding to four different statuses, e.g., (0,0), (1,0), (0,1), and (1,1), according to the types of charges trapped in the first charge trap layer CT1 and the second charge trap layer CT2. The four statuses may correspond to those shown in FIGS. 9A through 9D.

Figure 9A:
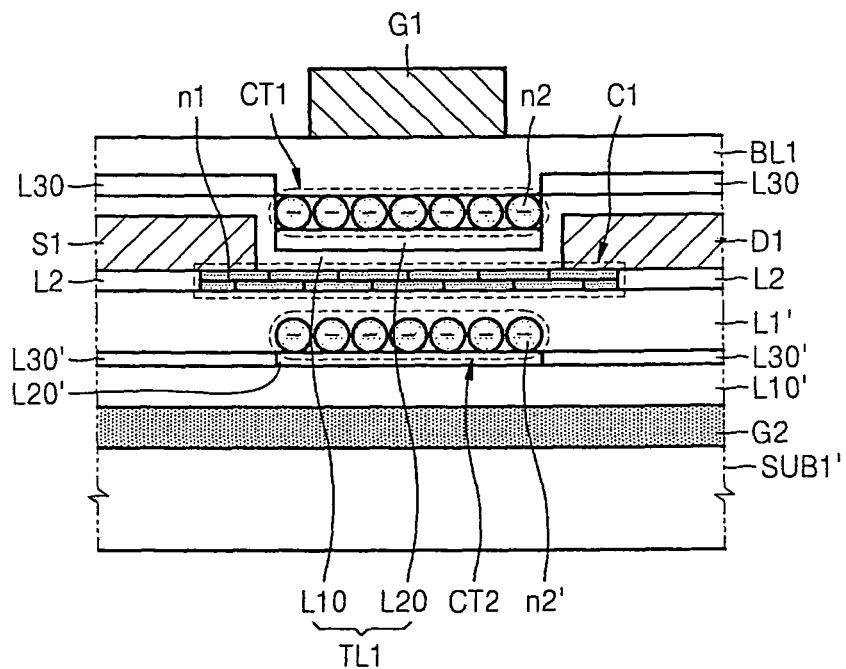
FIGS. 9A through 9D are cross-sectional views illustrating four different statuses of the semiconductor device shown in FIG. 3.

Referring to FIG. 9A, electrons may be trapped in both the first charge trap layer CT1 and the second charge trap layer CT2. To this end, a positive high voltage may be applied to the first control gate G1 and the second control gate G2.

Figure 9B:
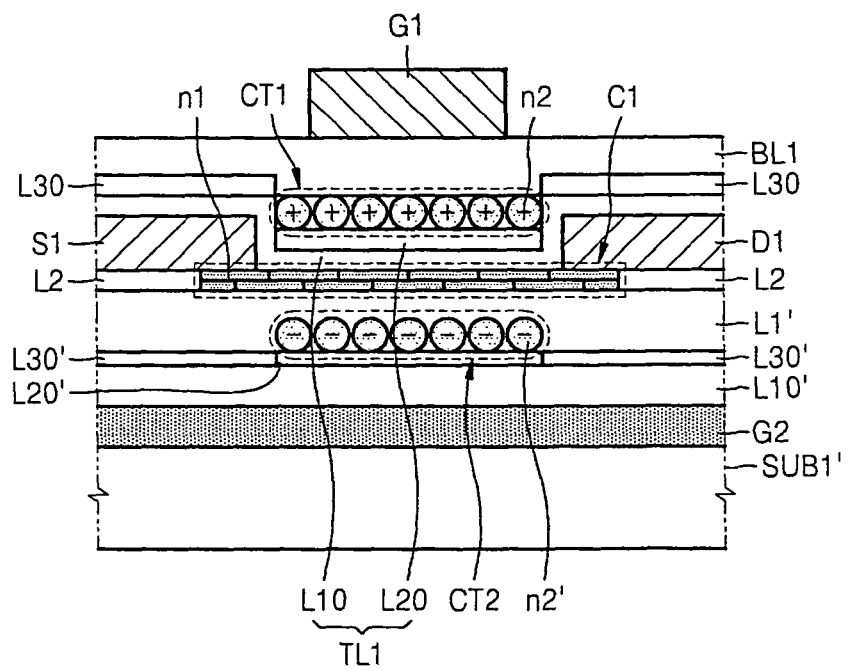

Referring to FIG. 9B, holes may be trapped in the first charge trap layer CT1, and electrons may be trapped in the second charge trap layer CT2. To this end, a negative high voltage may be applied to the first control gate G1, and a positive high voltage may be applied to the second control gate G2.

Figure 9C:
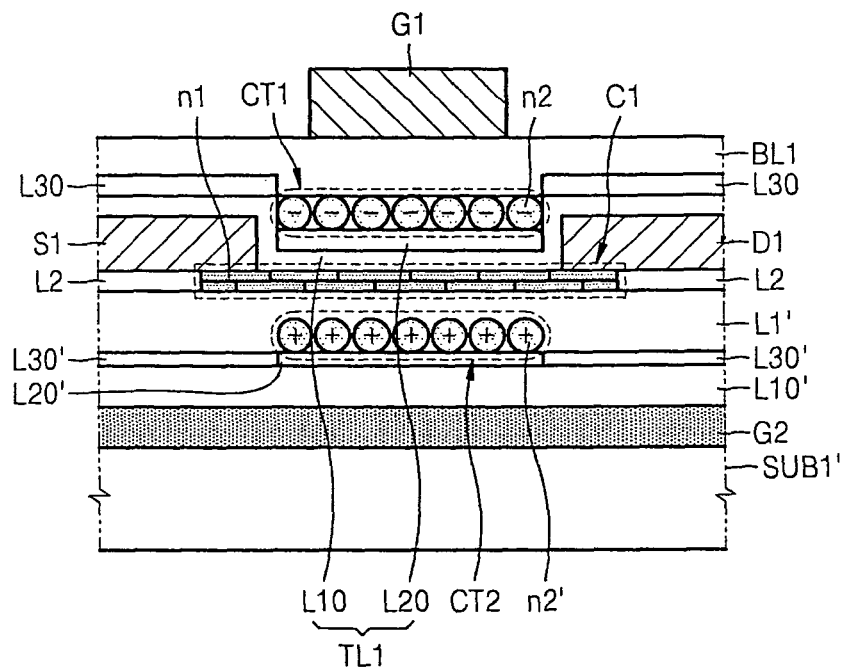

Referring to FIG. 9C, electrons may be trapped in the first charge trap layer CT1, and holes may be trapped in the second charge trap layer CT2. To this end, a positive high voltage applied to the first control gate G1, and a negative high voltage may be applied to the second control gate G2. The status shown in FIG. 9C may be regarded as being similar to that shown in FIG. 9B in view of the fact that holes may be trapped in a side of the channel layer C1 and electrons may be trapped in another side thereof. However, if the upper structure of the channel layer C1 may be not perfectly symmetrical with the lower structure thereof, the statuses shown in FIGS. 9B and 9C may have different resistances. In more detail, the statuses shown in FIGS. 9B and 9C may have different resistances when the first tunnel insulation layer TL1 and the second tunnel insulation layer L10'+L20' may be different from each other in terms of the thickness and the materials, and the first and second charge trap layers CT1 and CT2 may be different from each other in terms of the materials and size.

Figure 9D:
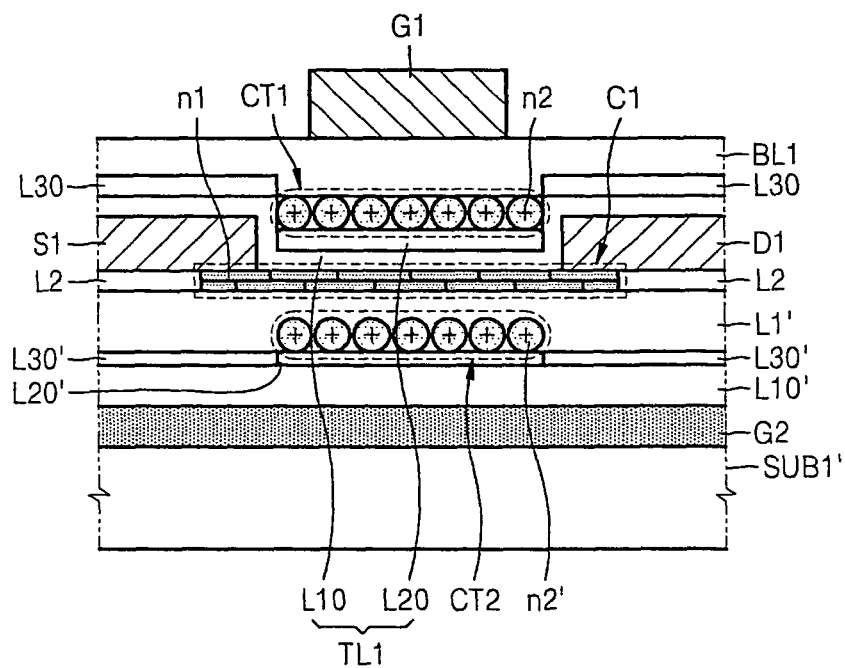

Referring to FIG. 9D, holes may be trapped in both the first charge trap layer CT1 and the second charge trap layer CT2. To this end, a negative high voltage may be applied to the first control gate G1 and the second control gate G2.

Therefore, in the present embodiment, a multi-bit memory device in which a unit memory cell may have four different resistance statuses may be realized.

Figure 10:
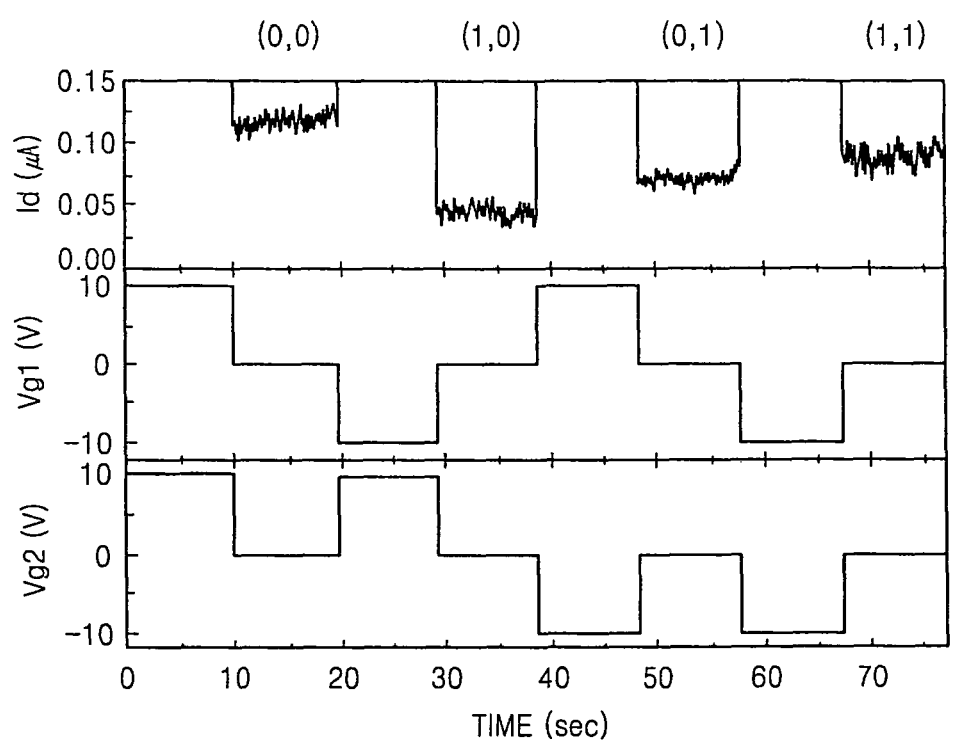

FIG. 10 is a graph illustrating waveforms of two gate voltages (hereinafter, referred to as first and second gate voltages) Vg1 and Vg2 applied to the first and second control gates G1 and G2 of the semiconductor device shown in FIG. 3, and a variation of the drain current Id with respect to the first and second gate voltages Vg1 and Vg2 according to an example embodiment. The graph relates to the semiconductor device having the structure shown in FIG. 3 and the characteristics shown in FIG. 8A. In this regard, a voltage between the source electrode S1 and the drain electrode D1 may be about 1V.

Referring to FIG. 10, the application of +10V to the first and second control gates G1 and G2 results in a status of (0, 0). The application of −10V to the first control gate G1 and the application of +10V to the second control gate G2 results in a status of (1, 0). The application of +10V to the first control gate G1, and the application of −10V to the second control gate G2 results in a status of (0, 1). The application of −10V to the fist and second control gates G1 and G2 results in a status of (1, 1). The drain current Id differs in the statuses (0, 0), (1, 0), (0, 1), and (1, 1).

While aspects of example embodiments may have been particularly shown and described with reference to differing embodiments thereof, it should be understood that these exemplary embodiments should be considered in a descriptive sense only and not for purposes of limitation. Descriptions of features or aspects within each embodiment should typically be considered as available for other similar features or aspects in the remaining embodiments. It would be appreciated by those of ordinary skill in the art that changes may be made in the structures shown in FIGS. 1 through 3 and the manufacturing methods shown in FIGS. 4A through 4I. For example, the channel layer C1 may be formed of an ambipolar material other than CNTs, e.g., grapheme.

Thus, although a few embodiments may have been shown and described, it would be appreciated by those of ordinary skill in the art that changes may be made in these embodiments without departing from the principles and spirit of example embodiments, the scope of which may be defined in the claims and their equivalents.

What is claimed is:

1. A semiconductor device comprising:
a non-hydrophobic layer;
a channel layer on the non-hydrophobic layer, the channel layer including a plurality of first nanostructures;
a hydrophobic layer on the non-hydrophobic layer around the channel layer;
a source electrode and a drain electrode on the hydrophobic layer and contacting both ends of the channel layer, respectively;
a first tunnel insulation layer on the channel layer, the first tunnel insulation layer including sequentially stacked first and second insulation layers, and the second insulation layer is one of a hydrophilic molecular layer and a hydrophobic molecular layer;
a first charge trap layer on the first tunnel insulation layer, the first charge trap layer including a plurality of second nanostructures different from the plurality of first nanostructures;
a first blocking insulation layer on the first charge trap layer; and
a first control gate on the first blocking insulation layer.

2. The semiconductor device of claim 1, wherein the plurality of first nanostructures are ambipolar.

3. The semiconductor device of claim 1, wherein the plurality of first nanostructures are nanowires.

4. The semiconductor device of claim 1, wherein the plurality of second nanostructures are nanoparticles.

5. The semiconductor device of claim 1, wherein the non-hydrophobic layer is a hydrophilic layer.

6. The semiconductor device of claim 1, further comprising:
a second control gate spaced apart from the channel layer, wherein the channel layer is disposed between the first and second control gates.

7. The semiconductor device of claim 6, further comprising:
a second charge trap layer disposed between the channel layer and the second control gate;
a second tunnel insulation layer disposed between the channel layer and the second charge trap layer; and
a second blocking insulation layer disposed between the second charge trap layer and the second control gate.

8. The semiconductor device of claim 7, wherein the second charge trap layer includes nanoparticles.

9. The semiconductor device of claim 1, wherein the semiconductor device is a transistor or a non-volatile memory device.

10. A method of manufacturing a semiconductor device, the method comprising:
providing a non-hydrophobic layer;
forming a hydrophobic layer on the non-hydrophobic layer, the hydrophobic layer having an opening that exposes a first area of the non-hydrophobic layer;
forming a channel layer on the first area exposed by the opening, the channel layer including a plurality of first nanostructures, the channel layer being formed on the nonhydrophobic layer and the hydrophobic layer being on the non-hydrophobic layer around the channel layer;
forming a source electrode and a drain electrode contacting both ends of the channel layer and on the hydrophobic layer;
forming a first tunnel insulation layer on the channel layer including,
sequentially stacking first and second insulation layers, the second insulation layer being one of a hydrophilic molecular layer and a hydrophobic molecular layer;
forming a first charge trap layer on the first tunnel insulation layer, the first charge trap layer including a plurality of second nanostructures different from the plurality of first nanostructures;
forming a first blocking insulation layer on the first charge trap layer; and
forming a first control gate on the first blocking insulation layer.

11. The method of claim 10, wherein the plurality of first nanostructures are ambipolar.

12. The method of claim 10, wherein the forming the channel layer comprises:
absorbing the plurality of first nanostructures in the first area exposed by the opening.

13. The method of claim 10, wherein the plurality of first nanostructures are nanowires.

14. The method of claim 10, wherein the forming the first tunnel insulation layer comprises:
forming an insulation layer that covers the channel layer, the source electrode, and the drain electrode; and
forming an absorption layer that absorbs the plurality of second nanostructures on the insulation layer above the channel layer between the source electrode and the drain electrode.

15. The method of claim 14, after the forming the insulation layer and prior to the forming the absorption layer, further comprising:
forming an anti-absorption layer on the insulation layer,
wherein the anti-absorption layer does not absorb the plurality of second nanostructures on the insulation layer excluding the area on which the absorption layer is to be formed.

16. The method of claim 10, wherein the plurality of second nanostructures are nanoparticles.

17. The method of claim 10, further comprising:
forming a second control gate spaced apart from the channel layer,
wherein the channel layer is disposed between the first and second control gates.

18. The method of claim 17, further comprising:
forming a second charge trap layer between the channel layer and the second control gate;
forming a second tunnel insulation layer between the channel layer and the second charge trap layer; and
forming a second blocking insulation layer between the second charge trap layer and the second control gate.

19. A semiconductor device comprising:
a non-hydrophobic layer;
a channel layer on the non-hydrophobic layer, the channel layer including a plurality of first nanostructures;
a hydrophobic layer on the non-hydrophobic layer around the channel layer;
a source electrode and a drain electrode on the hydrophobic layer and contacting both ends of the channel layer, respectively;
a first tunnel insulation layer on the channel layer;
a first charge trap layer on the first tunnel insulation layer, the first charge trap layer including a plurality of second nanostructures different from the plurality of first nanostructures;
a first blocking insulation layer on the first charge trap layer;

a first control gate on the first blocking insulation layer;
a second control gate spaced apart from the channel layer, the channel layer between the first and second control gates;
a second charge trap layer between the channel layer and the second control gate;
a second tunnel insulation layer between the channel layer and the second charge trap layer; and
a second blocking insulation layer between the second charge trap layer and the second control gate.

* * * * *